United States Patent [19]

Obata et al.

[11] Patent Number: 4,481,282

[45] Date of Patent: Nov. 6, 1984

[54] DRY PLANOGRAPHIC PLATES FOR DIRECT PRINTING WITH ELASTOMER UNDERLAYER

[75] Inventors: Hiroyuki Obata, Tokyo; Minoru Takamizawa; Yoshio Inoue, both of Gunma, all of Japan

[73] Assignees: Dai Nippon Printing Co., Ltd.; Shin-Etsu Chemical Co., both of Tokyo, Japan

[21] Appl. No.: 403,335

[22] Filed: Jul. 30, 1982

Related U.S. Application Data

[62] Division of Ser. No. 190,038, Sep. 23, 1980, abandoned.

[30] Foreign Application Priority Data

Sep. 28, 1979 [JP] Japan ................ 54-125131

[51] Int. Cl.³ .............. G03F 7/10; B41M 1/00
[52] U.S. Cl. .................. 430/303; 101/456; 430/271
[58] Field of Search ............. 430/271, 303; 101/456, 101/457, 453, 462, 401.1

[56] References Cited

U.S. PATENT DOCUMENTS

| | | | |
|---|---|---|---|
| 3,886,865 | 6/1975 | Ohto | 101/456 |
| 3,961,947 | 6/1976 | Wells | 430/303 |
| 4,003,312 | 1/1977 | Gunther | 401/401.1 |
| 4,019,904 | 4/1977 | Noshiro et al. | 104/456 |
| 4,254,209 | 3/1981 | Abe et al. | 430/303 |

*Primary Examiner*—Richard L. Schilling
*Attorney, Agent, or Firm*—Toren, McGeady and Stanger

[57] ABSTRACT

The invention provides a novel printing plate suitable for use in a dry-process direct planographic printing without the use of a blanket as used in offset printing and without the use of dampening water as in ordinary planographic printing. The printing plate of the invention is constructed with a substrate of which at least the surface layer is made of a rubbery elastomer with an oleophilic or ink-receptive surface and a pattern-wise layer of an ink-repellent material such as a silicone provided on the surface of the substrate to form the non-image areas of the printing plate while the image areas of the printing plate are formed by the oleophilic surface of the substrate exposed bare. By virtue of the rubbery elasticity of the surface layer of the substrate, satisfactorily sharp printed materials are obtained with the inventive printing plate without the use of a blanket as an intermediate carrier of the printing ink.

1 Claim, 2 Drawing Figures

DRY PLANOGRAPHIC PLATES FOR DIRECT PRINTING WITH ELASTOMER UNDERLAYER

This is a division of application Ser. No. 190,038, filed Sept. 23, 1980, now abandoned.

BACKGROUND OF THE INVENTION

The present invention relates to a planographic printing plate for direct printing and a method for the preparation thereof.

Direct planographic printing or direct lithography is a printing technique in which paper or other material to be printed is printed by direct transfer of the printing ink from an inked printing plate to the surface thereof without the use of a rubber blanket as an intermediate carrier of the printing ink from the planographic printing plate to the surface of the paper used in conventional offset printing. Direct lithography is widely practiced with a presensitized plate by use of dampening water for the printing of newspapers and the like.

Ordinary planographic printing plates are constructed by providing hydrophilic non-image areas and oleophilic, i.e. ink-receptive, image areas on the surface of a substrate plate made of a metal or other rigid materials such as aluminum. Printing with such a printing plate is carried out by first moistening the plate with dampening water so as that the hydrophilic areas alone are coated with water to become ink-repellent and then inking with a printing ink which adheres only to the oleophilic areas and is transferred to the paper to form printed images.

The above described printing method is usually called wet-process direct lithography since the method involves the step of water supply to the surface of the printing plate. The presence of water on the printing plate is, however, largely responsible for the problems in the printing method that the paper under press is moistened with unavoidable distortion or the printing ink becomes emulsified resulting in decreased printing density or non-uniformity of printing. Moreover, the printing pressure for the transfer of the printing ink cannot be sufficiently high with a planographic printing plate so that the quality of the printed images is sometimes poor with insufficient transfer of the printing ink as a result of the low printing pressure below necessity. Therefore, the wet-process direct lithorgraphy has been considered not to be suitable for obtaining high-quality printed materials.

On the other hand, there is also known a method of dry-process direct lithography which is a planographic printing without the use of the dampening water. The printing plate used in this dry-process direct lithography is constructed by providing non-image areas formed of an ink-repellent material such as a silicone resin and oleophilic, i.e. ink-receptive, image areas on the surface of a substrate plate made of a metal or other rigid material such as aluminum. Printing plates of this type require no dampening water since the ink-repellency and the ink-receptivity are the properties inherent to the surface of the plate.

Accordingly, the undesirable phenomena of distortion of the paper under press and the emulsification of the printing ink unavoidable in the wet-process direct lithography never take place in the dry-process direct lithography so that high printing density with stability is obtained. This method is, however, not free from the problem of the insufficient printing pressure as in the wet-process direct lithography so that difficulties are also encountered in preventing lowering of the quality of the printed images caused by the deficient transfer of the printing ink. Therefore, printed materials obtained by the dry-process direct lithography are not evaluated as a high-quality printed material although the general quality of the printed images is somewhat improved over the wet-process direct lithography.

Generally speaking, direct lithography is superior to letterpress printing but much inferior to offset printing for halftone photographic printing whereas it is somewhat superior to offset printing but inferior to letterpress printing for the printing of characters or other line drawings. Among conventionally practiced printing methods, offset printing can give the highest degree of smoothness of the printed materials with respect to the quality of the printed images.

The reason for the above superiority of the offset printing is the use of a so-called blanket. As is well known, offset printing is performed by first transferring the printing ink on the printing plate to the surface of a blanket made of a rubbery elastomer, from where the printing ink is retransferred to the surface of the paper or other material to be printed. Accordingly, the printing ink on the printing plate is transferred to the blanket evenly with good adaptability by virtue of the rubbery elasticity of the blanket material and retransfer of the printing ink to the surface of the paper is also carried out very smoothly owing to the compensation for the fine irregularity on the paper surface by the rubbery elasticity of the blanket material.

The reason for the inferiority of wet- or dry-process direct lithography for halftone photographic printing in comparison with offset printing is the rigidity of the substrate plate such as a metal and the printing ink adhering thereon is directly contacted with paper or other material having a rather rough surface. For example, papers have microscopically a coarse and stiff surface by the presence of paper textures or fibrous structure so that, when contacted with the surface of an also rigid printing plate, no good adaptation is obtained between them resulting in uneven transfer of the printing ink and consequently degraded quality of the printed material. A remedy for this defect of poor adaptability is the increase of the local printing pressure by raising the printing plate at the image areas approaching to the surface condition of a plate for letterpress printing or application of an extremely large printing pressure. Application of an extremely large printing pressure is not practical because of the shortened durability of the planographic printing plate to an impractical extent in addition to the problem in the printing press per se which is usually not designed to give such an extraordinary large printing pressure or operated only with frequent troubles under such an extreme condition. At any rate, therefore, high quality cannot be expected in the printed materials obtained by the conventional techniques of direct lithography.

SUMMARY OF THE INVENTION

It is therefore an object of the present invention to provide a novel and improved printing plate for direct dry planographic printing or dry-process direct lithography free from the above described problems in the prior art printing plates for dry-process direct lithography.

The printing plate of the invention for the dry-process direct planographic printing comprises:

(a) a substrate, at least the surface layer thereof being made of a rubbery elastomer, with an oleophilic surface, and (b) a pattern-wise layer of an ink-repellent material provided on the oleophilic surface of the substrate forming the non-image ares of the printing plate, the image areas of the printing plate being formed of the oleophilic surface of the substrate exposed bare on the areas not provided with the layer of the ink-repellent material.

DETAILED DESCRIPTION OF THE PREFERRED EMBODIMENTS

The substrate of the inventive printing plate may be either in a form of a flat plate or in a form of a cylinder according to the type of the printing press on which the printing plate is mounted. At least the surface layer of the substrate must be made of a rubbery material having sufficient elasticity but it may be formed as a whole of a rubbery elastomer. For example, the printing plate illustrated in FIG. 1 by the partial cross section has a substrate which is a stratified body composed of a rigid layer of base 1 made, for example, of a metal such as aluminum and a thin surface layer 2 made of a rubbery material. Alternatively FIG. 2 illustrates another printing plate of the invention having a substrate 2' which is made, as a whole, of a rubbery material. At any rate, the surface of the rubbery layer 2 or 2' must be oleophilic exhibiting good receptivity for printing inks.

Figure 1:
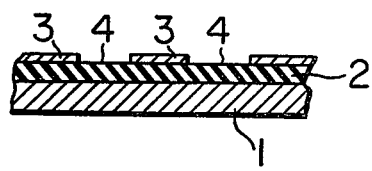
FIG. 1 is a cross sectional view of part of the inventive printing plate of which the substrate is composed of a rigid base and a rubbery surface layer.
Figure 2:
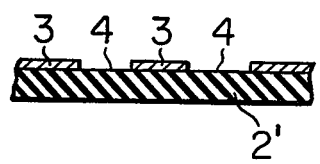
FIG. 2 is a cross sectional view of part of the inventive printing plate of which the substrate as a whole is formed of a rubbery material.

In the printing plates illustrated in FIG. 1 and FIG. 2 by their partial cross sections, a pattern-wise layer made of an ink-repellent material 3 is provided on the oleophilic surface of the rubbery layer 2 or 2' forming the non-image areas of the printing plate while the image areas of the printing plate are provided by the oleophilic surface of the rubbery material 4 exposed bare on the areas not provided with the pattern-wise layer 3 of the ink-repellent material.

The base 1 in FIG. 1 is usually made of a metal such as aluminum, steel and the like though not limited thereto and any other material may be used provided that they have good dimensional stability both mechanically and thermally. It should also be taken into consideration that good adhesive bonding is obtained between the surface of the base 1 and the layer 2 of the rubbery material.

The layer 2 or 2' of the rubbery material is required to have an oleophilic surface. This means that the rubbery material is not always required to be oleophilic in itself. For example, even a rubbery material which is poorly oleophilic in itself may be used for the layer 2 or 2' if an appropriate chemical or physical means is available for rendering the surface of the layer 2 or 2' oleophilic. Natural rubber and most of organic synthetic rubbers are suitable as such for forming the layer 2 or 2' with good oleophilic property. On the contrary, silicon rubbers and fluorocarbon rubbers are rather oleophobic so that an oleophilic treatment is usually undertaken when the layer 2 or 2' is made of these rubbers.

The thickness of the rubbery layer 2 on the base 1 is not particularly limitative and should be determined in consideration of the parameters such as the hardness of the rubbery material, surface condition of the paper or other material to be printed, rheological properties of the printing ink and the like. It is, however, preferably at least 10 $\mu$m because a too small thickness of the rubbery layer 2 leads to an insufficient durability of the printing plate in addition to the problem that the printing plate has no performance something like the elastic behavior of the blanket in the offset printing.

When a substrate 2' made of a rubbery material as a whole is used, on the other hand, the thickness of the substrate 2' is preferably at least 0.5 mm although this limitation is not critical if handling of the printing plate does not undergo inconvenience before it is mounted on a printing press.

Following is a description of a typical method for providing a pattern-wise layer 3 of an ink-repellent material on the surface of the rubbery layer 2 or 2' for forming the non-image areas on the printing plate. That is, the surface of the rubbery layer 2 or 2' is first coated with a photocurable silicone resin in a suitable coating thickness and the photocurable silicone resin is exposed to light patternwise through a positive transparency in direct contact therewith followed by a development to remove the uncured silicone resin on the unexposed areas to leave the photocured silicone resin forming the non-image areas 3 on the plate.

Alternatively, a photosensitive coating layer is provided on the surface of the rubbery layer 2 or 2' with an organic photocurable polymeric material which is subjected to exposure to light through a negative transparency followed by the development treatment in the same manner as above and subsequently whole surface of the plate is coated with an ink-repellent material. Then the surface of the plate is gently rubbed with a soft cloth wetted with a solvent capable of swelling the photocured polymer remaining on the exposed areas so as that the ink-repellent material on the layer of the photocured resin in the areas exposed to light is removed together with the latter as swollen with the solvent to expose the surface of the base plate bare which forms the image areas of the printing plate. This method is called a "lift-off process".

In the above described lift-off process using a negative transparency, the photosensitive coating layer is usually formed with a photocurable cinnamic ester of a polyvinyl alcohol available, for example by the tradenames of KPR (product by Eastman Kodak Co.) and TPR (product by Tokyo Ohka Kogyo Co.) or a photocurable azide rubber available, for example, by the tradenames of KMER (product by Eastman Kodak Co.) and OMR (product by Tokyo Ohka Kogyo Co.).

On the other hand, the lift-off process is also carried out by the exposure to light through a positive transparancy. In this case, the photosensitive layer is formed with a photodecomposable resin such as the orthoquinone diazide resins available, for example, from Shipley Co. By the tradenames of AZ-series ones or from Tokyo Ohka Kogyo Co. by the tradename of Photosol. Thus a photosensitive coating layer is provided on the surface of the rubbery layer 2 or 2' with the above mentioned photodecomposable resin which is subjected to exposure to light through a positive transparency followed by the development treatment to dissolve away the resin on the exposed areas. Thereafter, whole surface of the plate is coated with an ink-repellent material such as a silicone resin and dipped in a solvent so as that the photodecomposable resin remaining on the unexposed areas is dissolved away and removed together with the ink-repellent material thereon to expose the surface of the substrate bare which forms the image areas of the plate while the ink-repellent material on the areas exposed to light remains intact to give the non-image areas.

The printing plate prepared in either one of the above described processes has in any way a pattern-wise layer 3 of the ink-repellent material on the rubbery layer 2 or 2' forming the non-image areas of the printing plate while the oleophilic surface of the rubbery material 2 or 2' exposed bare on the areas not provided with the ink-repellent layer 3 forms the image areas 4 of the printing plate. Supply of the printing ink to the surface of the thus prepared printing plate may be carried out in a conventional manner. Transfer of the printing ink from the thus inked printing plate to the surface of the paper or other material to be printed under press takes place with unexpected smoothness by virtue of the elasticity effect exhibited by the rubbery layer 2 or 2' of the printing plate. So to speak, the printing plate per se is imparted with a performance of a blanket so that the quality of the printed materials obtained therewith is very much improved to a comparable level with the offset printing even by the direct planographic printing.

Further advantages are obtained in the inventive direct planographic printing that the principle of the inventive plate making method is applicable also to the cylindrical printing plate for endless printing which is hitherto considered to be possible only by the gravure printing. In this case, gravure doctors indispensable in the gravure printing are no longer necessary and endless printing can be satisfactorily performed with a mere combination of the printing cylinder and an inking roller. In addition, in contrast to the expensiveness of the gravure cylinders, the printing cylinder according to the present invention is outstandingly inexpensive almost in the same degree as of ordinary planographic printing plates.

Although the advantages of the present invention in the improved quality of the printed images may supposedly be obtained also in wet-process direct lithography provided that the printing plate has the same structure as in the present invention, the fact is, however, different because rubbery elastomers are generally oleophilic or hydrophonic so that selective moistening of the non-image areas with water as in a metal-made plate is difficult or practically almost impossible. Accordingly, the advantages obtained by the invention is limited to the dry-process and not extensible to the wet-process.

As is mentioned before, the rigid base 1 is not always indispensable so as that the direct planographic printing plate of the invention may have a structure as shown in FIG. 2. where the whole body of the plate is made of a rubbery elastomer 2'. The plate of this type has an unavoidable disadvantage due to the absence of the rigid base that the plate is subject to deformation or stretching by an outer tension. Therefore, printing plates of this type are desirably used in printing of small areas or printing in which dimensional accuracy is not essential.

The direct planographic printing by use of the printing plate of the present invention is very excellent as a printing method in which the defects involved in the wet-process direct planography as mentioned before can totally eliminated.

The rubbery layer 2 or 2' is formed with an organic rubbery elastomer having suitable elasticity. It is of course optional to use a rubbery blend of two kinds or more of such rubbery elastomers or the layer 2 or 2' is a laminate of different kinds of rubbery elastomers. The rubbery elastomers suitable for use are exemplified by, though not limitative, natural rubber, dienic synthetic rubbers such as SBR, NBR, IIR and the like, stereo rubbers such as cis-1,4-polyisoprene, cis-1,4-polybutadiene and the like, urethane rubbers, chlorosulfonated polyethylene rubbers, acrylic rubbers, polysulfide rubbers, silicone rubbers, fluorocarbon rubbers, nitroso rubbers and the like.

The pattern-wise ink-repellent layer 3 forming the non-image areas on the plate is obtained by photocuring a suitable photosensitive resinous material such as certain kinds of photosensitive silicone resins capable of being readily cured on exposure to light to give an ink-repellent surface. Examples of suitable photosensitive silicone resins are: organopolysiloxanes containing organosiloxane units having substituted or unsubstituted maleimido groups bonded thereto (see Japanese Patent Disclosures Nos. 51-120804, 51-125277, 52-13907, 52-105002 and 52-116304); organopolysiloxane containing organisiloxane units having substituted or unsubstituted acryloxy groups bonded thereto (see Japanese Patent Disclosures 48-16991, 48-19682, 48-21779, 48-23880, 48-47997, 48-48000, 48-83722, 51-34291, 51-52001, 52-105003, 52-105004, 52-113805 and 52-113801); mixtures of an organopolysiloxane containing organosiloxane units having mercapto groups and an organopolysiloxane containing organosiloxane units having vinyl groups bonded thereto (see Japanese Patent Disclosure No. 53-17405); and mixtures of an organopolysiloxane containing organosiloxane units having vinyl groups bonded thereto and an organohydrogenpolysiloxane (see Japanese Patent Disclosure No. 53-15907).

When the non-image areas are to be formed by the lift-off process, the above named photosensitive silicone resins may also be used but use of ordinary photosensitive organic resins is usually preferred such as a photosensitive diazo resin. As is mentioned before, the substrate having a rubbery surface layer is first coated with the photosensitive resin, e.g. diazo resin, exposed pattern-wise to light, developed and then coated with an ink-repellent coating material. Suitable ink-repellent coating material for this overcoating is exemplified by silicones for release papers, room-temperature curable or photocurable silicone rubbers, silicone resins for varnish and fluorocarbon resins.

In the following, the present invention is described in further detail by way of examples, in which the symbols Me and Ph denote a methyl group and a phenyl group, respectively, and parts are all given by parts by weight.

EXAMPLE 1

A solution prepared by dissolving 260 g of dimethyldichlorosilane and 50 g of phenyltrichlorosilane in 1000 g of toluene was added dropwise into 1100 g of water kept at 25° C. or below under agitation to effect cohydrolysis of the silanes followed by washing with water, neutralization and dehydration to give a toluene solution containing 15% by weight of an organopolysiloxane. Into 1000 g of this toluene solution were added 56 g of 3-aminopropyltriethoxysilane and 0.2 g of dibutyltin dioctoate so as that the deethanolation condensation took place to give a toluene solution of a 3-aminopropylcontaining organopolysiloxane expressed by the following unit formula:

$$(Me_2SiO)_{200}(PhSiO_{1.5})_{24}(H_2NC_3H_6SiO_{1.5})_{2.2}.$$

In the next place, a solution of 3.94 g of α-phenylmaleicanhydride in 10 ml of dimethylformamide was added into this toluene solution of the 3-aminopropyl-containing organopolysiloxane at 20° C. This amount of the α-phenylmaleic anhydride was equimolar to the 3-aminopropyl group of the organopolysiloxane. The reaction mixture was agitated first at 25° C. for 1 hour and then at 110° C. for 4 hours with continuous removal of the condensation water out of the reaction mixture. The resultant toluene solution contained an organopolysiloxane having α-phenylmaleimido-containing organosiloxane units as evidenced by the infrared absorption spectral analysis. The organopolysiloxane was when freed from the solvent, a solid at room temperature having a softening point at 110° to 120° C. and expressed by the following unit formula, in which Q denotes an α-phenylmaleimido group:

$$(Me_2SiO)_{200}(PhSiO_{1.5})_{24}(QC_3H_6SiO_{1.5})_{2.2}.$$

On the other hand, an aluminum plate of 0.2 mm thickness was coated all over the surface thereof with a photosensitive rubber solution (a product by Tokyo Ohka Kogyo Co., tradename OMR) and, after drying, exposed to light to give a coating layer of about 20 μm thickness having rubbery elasticity. The surface of this rubbery layer was successively coated with a primer (as product by Shin-Etsu Chemical Co., tradename KSP 41) in a coating thickness of about 0.5 μm as dried and then with the above prepared toluene solution of the α-phenylmaleimido-containing organopolysiloxane in a coating thickness of about 10 μm as dried.

Thus prepared plate was exposed to light through a photographic transparency in direct contact therewith followed by development treatment to give a printing plate. A test printing run of dry-process direct planography was undertaken with this printing plate mounted on a movable-type rotary leaf press (manufactured by Tokyo Kikai Seisakusho) to give more than 10,000 copies of printed materials of satisfactory quality as good as those obtained by use of a blanket.

EXAMPLE 2

A mixture of 247 g of a 15% toluene solution of an α,ω-dihydroxydimethylpolysiloxane expressed by the formula $$HO \text{---} (Me_2SiO)_{500} \text{---} H$$

and 60 g of a 15% toluene solution of a hydrolysis product of phenyltrichlorosilane was admixed with 0.25 g of 3-methacryloxypropyltrimethoxysilane, 0.01 g of dibutylhydroxytoluene and 0.1 g of dibutyltin dilaurate and the condensation reaction was carried out for 8 hours under reflux of toluene with continuous removal of the condensation water out of the reaction mixture to give a 15% toluene solution of a photosensitive copolymeric organopolysiloxane having a viscosity of 28.5 centistokes at 25° C. A coating solution was prepared by diluting 100 parts of the above obtained organopolysiloxane solution with 900 parts of toluene with admixture of 5 parts of 4-trimethylsilylbenzophenone.

On the other hand, a base plate having a rubbery surface layer was prepared by adhesively bonding a sheet of styrenebutadiene rubber of 1 mm thickness to a steel plate of 0.2 mm thickness.

Preparation of a printing plate and the direct planographic printing test was undertaken in the same manner as in Example 1 with the above described base plate as the substrate and the organopolysiloxane-containing coating solution to give approximately identical results.

EXAMPLE 3

A solution prepared by dissolving 258 g of dimethyldichlorosilane and 53 g of phenyltrichlorosilane in 1022 g of toluene was added dropwise into 1124 g of water kept at 25° C. or below under agitation to effect cohydrolysis of the silanes. Subsequent washing of the reaction mixture with water followed by neutralization and drying gave a toluene solution containing 15% by weight of the organopolysiloxane cohydrolyzate.

Into 1200 g of the above toluene solution were admixed 7.4 g of 3-methacryloxypropylmethyldimethoxysilane, 6.0 g of 4-dimethylamino-4'-(trimethoxysilylethyl) dimethylsilylbenzophenone, 0.1 g of methoxyhydroquinone and 0.4 g of dibutyltin dioctoate and the reaction mixture was heated for 5 hours under reflux of toluene to effect the condensation reaction. The resultant solution had a solid content of 15% by weight and a viscosity of 20.1 centistokes at 25° C.

On the other hand, a blanket for planographic printing, which was a laminated body of a woven cloth and a rubber sheet exhibiting rubbery elasticity as a whole, was coated on the surface of the rubber sheet with the same primer as used in Example 1 in a coating thickness of about 0.5 μm and then with the above prepared toluene solution of the self-sensitizing photocurable organopolysiloxane in a coating thickness of about 8 μm as dried.

Photographic plate making and the direct planographic printing test were undertaken in the same manner as in Example 1 to give more than 10,000 copies of satisfactorily sharp printed materials.

EXAMPLE 4

Substantially the same procedure was repeated as in Example 2 for the plate making and direct planographic printing test except that the coating solution of silicone was prepared by dissolving 100 parts of a block-copolymerized organopolysiloxane expressed by the following unit formula $$(CH_2\!\!=\!\!CH\!\!-\!\!C_3H_6\!\!-\!\!SiO_{1.5})_4(PhSiO_{1.5})(Me_2SiO)_{400},$$

5 parts of tetra-3-mercaptopropyl tetramethylcyclotetrasiloxane and 2 parts of 4,4'-bis(dimethylamino)benzophenone in 900 parts of toluene. The results were approximately identical with those in Example 2.

EXAMPLE 5

The experimental procedure was the same as in Example 4 except that the tetra-3-mercaptopropyl tetramethylcyclotetrasiloxane was replaced with the same amount of 1,3,5,7-tetramethylcyclotetrasiloxane. The results of the direct planographic printing test were approximately identical with those in Example 2.

EXAMPLE 6

A substrate plate having a rubbery surface layer was prepared in the same manner as in Example 1 and coated with a diazo-type photodecomposable resin solution (a product by Tokyo Ohka Kogyo Co., tradename Photosol) followed by drying, pattern-wise exposure to light through a photographic positive transparency in direct contact therewith and development.

The surface of the thus obtained plate was then successively coated first with the same primer as used in Example 1 in a coating thickness of about 0.5 µm as dried and then with a silicone resin solution (a product by Shin-Etsu Chemical Co., tradename KS 705F) in a coating thickness of about 15 µm as dried followed by curing of the silicone and development of the plate by the lift-off process by use of methylethylketone as the remover solvent to give a printing plate.

The direct planographic printing test carried out in the same manner as in Example 1 with the above prepared printing plate gave more than 10,000 copies of satisfactory printed materials as good as those obtained by use of a blanket.

EXAMPLE 7

The same experimental procedure was repeated as in Example 6 except that the substrate plate was a sheet of SBR rubber of 1 mm thickness instead of the rubber-coated aluminum plate used in Example 6.

The plate making and the direct planographic printing test undertaken in the same manner as in Example 6 gave results almost as good as in Example 6.

What is claimed is:

1. A method for the preparation of a printing plate for dry-process direct planographic printing which comprises the steps of
   (a) coating a substrate plate made of a metal and provided on the surface with a layer made of a rubbery elastomer having an oleophilic surface with a photocurable organopolysiloxane all over the surface thereof to form a photosensitive layer;
   (b) exposing the photosensitive layer pattern-wise to light through a positive transparency in direct contact with the substrate surface in such a dose that the photocurable organopolysiloxane on the exposed areas is cured to form the non-image areas of the printing plate; and
   (c) removing the uncured organopolysiloxane on the unexposed areas by development so as to expose the oleophilic surface of the substrate bare to form the image areas of the printing plate.

* * * * *